United States Patent
West et al.

(12)

(10) Patent No.: US 10,224,081 B2
(45) Date of Patent: Mar. 5, 2019

(54) DYNAMIC RANDOM ACCESS MEMORY (DRAM) BACKCHANNEL COMMUNICATION SYSTEMS AND METHODS

(71) Applicant: QUALCOMM Incorporated, San Diego, CA (US)

(72) Inventors: David Ian West, San Diego, CA (US); Michael Joseph Brunolli, Escondido, CA (US); Dexter Tamio Chun, San Diego, CA (US); Vaishnav Srinivas, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/849,463

(22) Filed: Dec. 20, 2017

(65) Prior Publication Data

US 2018/0114553 A1 Apr. 26, 2018

Related U.S. Application Data

(62) Division of application No. 14/591,056, filed on Jan. 7, 2015, now Pat. No. 9,881,656.

(60) Provisional application No. 61/925,299, filed on Jan. 9, 2014.

(51) Int. Cl.
| | |
|---|---|
| *G11C 7/10* | (2006.01) |
| *G06F 12/00* | (2006.01) |
| *G11C 11/4076* | (2006.01) |
| *G06F 11/10* | (2006.01) |
| *G11C 11/406* | (2006.01) |

(52) U.S. Cl.
CPC ........ *G11C 7/1063* (2013.01); *G06F 11/1004* (2013.01); *G06F 11/1048* (2013.01); *G06F 12/00* (2013.01); *G11C 11/406* (2013.01); *G11C 11/4076* (2013.01); *G11C 11/40611* (2013.01)

(58) Field of Classification Search
None
See application file for complete search history.

(56) References Cited

U.S. PATENT DOCUMENTS

| | | | |
|---|---|---|---|
| 5,335,895 A | 8/1994 | Sell | |
| 9,432,298 B1 * | 8/2016 | Smith | ................ H04L 49/9057 |
| 2008/0005647 A1 | 1/2008 | Bains | |

(Continued)

FOREIGN PATENT DOCUMENTS

| | | |
|---|---|---|
| CN | 1637731 A | 7/2005 |
| CN | 102214152 A | 10/2011 |

(Continued)

OTHER PUBLICATIONS

Author Unknown, "Post LPDDR4 (LPDRAM5) Proposal," JC42.6, Dec. 2014, JEDEC, 11 pages.

(Continued)

*Primary Examiner* — Denise Tran
(74) *Attorney, Agent, or Firm* — Withrow & Terranova, PLLC

(57) ABSTRACT

Dynamic random access memory (DRAM) backchannel communication systems and methods are disclosed. In one aspect, a backchannel communication system allows a DRAM to communicate error correction information and refresh alert information to a System on a Chip (SoC), applications processor (AP), or other memory controller.

3 Claims, 4 Drawing Sheets

(56) References Cited

U.S. PATENT DOCUMENTS

| | | | |
|---|---|---|---|
| 2008/0155378 A1 | 6/2008 | Amidi | |
| 2008/0195922 A1 | 8/2008 | Lee | |
| 2011/0246713 A1 | 10/2011 | Bains | |
| 2012/0317352 A1 | 12/2012 | Kang et al. | |
| 2013/0117641 A1 | 5/2013 | Bains et al. | |
| 2013/0279283 A1* | 10/2013 | Seo .................. | G11C 11/40611 365/222 |
| 2015/0194197 A1 | 7/2015 | West et al. | |

FOREIGN PATENT DOCUMENTS

| | | | |
|---|---|---|---|
| CN | 103377695 | A | 10/2013 |
| EP | 2068245 | A2 | 6/2009 |
| JP | S57150227 | A | 9/1982 |
| JP | H065069 | A | 1/1994 |

OTHER PUBLICATIONS

International Search Report and Written Opinion for PCT/US2015/010583, dated Mar. 24, 2015, 9 pages.
Second Written Opinion for PCT/US2015/010583, dated Dec. 17, 2015, 7 pages.
Third Written Opinion for PCT/US2015/010583, dated Apr. 20, 2016, 7 pages.
International Preliminary Report on Patentability for PCT/US2015/010583, dated Jun. 13, 2016, 29 pages.
Office Action of the Intellectual Property Office for Taiwan Patent Application No. 104100580, dated May 3, 2018, 15 pages.

* cited by examiner

DYNAMIC RANDOM ACCESS MEMORY (DRAM) BACKCHANNEL COMMUNICATION SYSTEMS AND METHODS

PRIORITY CLAIMS

The present application is a division of and claims priority to U.S. patent application Ser. No. 14/591,056, now U.S. Pat. No. 9,881,656, filed on Jan. 7, 2015 and entitled "DYNAMIC RANDOM ACCESS MEMORY (DRAM) BACKCHANNEL COMMUNICATION SYSTEMS AND METHODS," which is incorporated herein by reference in its entirety.

The '056 application claims priority to U.S. Provisional Patent Application Ser. No. 61/925,299 filed on Jan. 9, 2014 and entitled "DYNAMIC RANDOM ACCESS MEMORY (DRAM) BACKCHANNEL COMMUNICATION SYSTEMS AND METHODS," which is incorporated herein by reference in its entirety.

BACKGROUND

I. Field of the Disclosure

The technology of the disclosure relates generally to memory structures in computing devices.

II. Background

Memory for computing devices comes in a variety of forms. Random Access Memory (RAM) is commonly used by operating systems and applications within computing devices, and is provided in two different types. Static RAM (SRAM) holds its charge indefinitely without a need for external power. In contrast, dynamic RAM (DRAM) stores each bit of data in a capacitor, which leaks charge over time and must periodically be refreshed.

Recent proposals in the DRAM standard have indicated a desire to have additional information flow back from the DRAM to an applications processor (AP) or a System on a Chip (SoC). Historically, such information is provided across a physical layer (PHY) of the DRAM, and only a data plane (DQ) is bidirectional. In the next generation of Low Power DRAM (LP-DRAM), the proposals add error detection or correction information and specifically add cyclic redundancy checking (CRC) information to the information that is passed back to the SoC. While adding CRC information has been effectuated in the double data rate (DDR) release 4 (DDR4), it has not been done in the low power (LP) DDR5 DRAM environment. Adding CRC to the LP DDR5 standard will allow missed transmissions to be retransmitted, avoiding catastrophic system failure.

An additional change that has been requested by some of the DRAM vendors is greater control over the refresh rate. The need for greater control over the refresh rate arises from the increasingly weak charge that is held in modern DRAM capacitors. Under the old rules, the charges were refreshed periodically based on the weakest DRAM.

Thus, there is a need to allow for CRC communication and there needs to be a way for the DRAM to indicate to the SoC that a particular type of refresh (e.g., bank, row, full refresh) is needed by the DRAM.

SUMMARY OF THE DISCLOSURE

Aspects disclosed in the detailed description include dynamic random access memory (DRAM) backchannel communication systems and methods. In particular, various exemplary aspects allow a DRAM to communicate error correction information and refresh alert information to a System on a Chip (SoC), applications processor (AP), or other memory controller.

While it is particularly contemplated that error correction and refresh alert information are the types of information that will be sent on the backchannel, it should be appreciated that other data may also be sent on the backchannel, including, but not limited to, temperature information, calibration information, and the like.

In exemplary aspects, the backchannel is provided over existing, underutilized pins and wires connecting the DRAM to the SoC. Exemplary pins are the clock enable (CKE) or chip select (CS) pins (or both). Reuse of existing pins saves valuable real estate within the integrated circuit (IC) and avoids the expense of running additional wires to the DRAM. Furthermore, avoiding additional wires eliminates possible electromagnetic interference (EMI) issues that might arise from the presence of the additional wires. Power conservation may also be achieved relative to an aspect with multiple new pins because not as many drivers and receivers are needed on a device with a lower pin count. Other possible solutions include adding an additional pin(s) and wire(s) to the DRAM to provide an appropriate communication backchannel In this regard, in one aspect, a memory system is provided. The memory system comprises an AP comprising an AP pin. The memory system also comprises at least one DRAM comprising a pin, and a backchannel line coupling the AP pin to the pin. The AP is configured to receive at least one of: error correction information and refresh alert information from the at least one DRAM through the backchannel line.

In another aspect, a memory system is provided. The memory system comprises an AP and at least one DRAM. The memory system also comprises a CKE line coupling the AP to the at least one DRAM. The AP is configured to receive at least one of: error correction information and refresh alert information from the at least one DRAM through the CKE line.

In a further aspect, a memory system is provided. The memory system comprises an AP and at least one DRAM. The memory system also comprises a CS line coupling the AP to the at least one DRAM. The AP is configured to receive at least one of: error correction information and refresh alert information from the at least one DRAM through the CS line.

In another aspect, a method for providing information to an AP from a DRAM is provided. The method comprises providing an AP comprising an AP pin, and providing at least one DRAM comprising a pin. The method further comprises providing a backchannel line coupling the AP pin to the pin. The method also comprises receiving, at the AP, at least one of: error correction information and refresh alert information from the at least one DRAM through the backchannel line.

In another aspect, a method for providing information to an AP from a DRAM is provided. The method comprises providing an AP, and providing at least one DRAM. The method further comprises providing a CKE line coupling the AP to the at least one DRAM. The method also comprises receiving, at the AP, at least one of: error correction information and refresh alert information from the at least one DRAM through the CKE line.

In another aspect, a method for providing information to an AP from a DRAM is provided. The method comprises providing an AP, and providing at least one DRAM. The method further comprises providing a CS line coupling the AP to the at least one DRAM. The method also comprises receiving, at the AP, at least one of: error correction information and refresh alert information from the at least one DRAM through the CS line.

DETAILED DESCRIPTION

Figure 1:
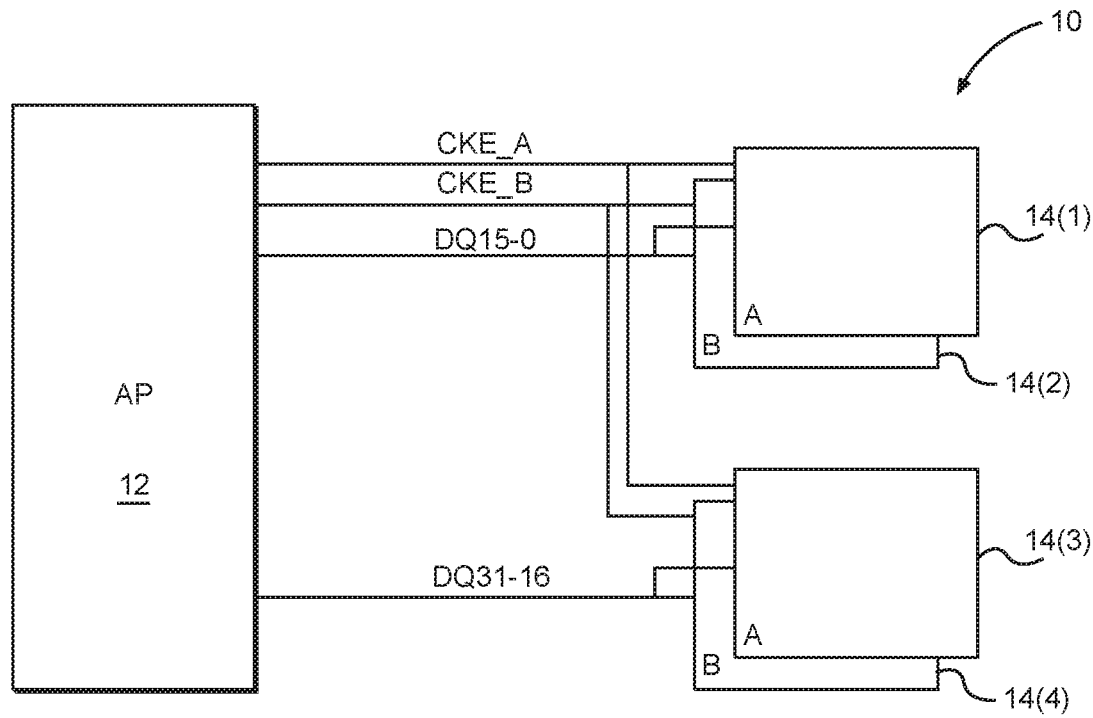
FIG. 1 is a block diagram of an exemplary conventional memory communication system with a memory controller and four dynamic random access memory (DRAM) units.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include dynamic random access memory (DRAM) backchannel communication systems and methods. In particular, various exemplary aspects allow a DRAM to communicate error correction information and refresh alert information to a System on a Chip (SoC), applications processor (AP), or other memory controller.

While it is particularly contemplated that error correction and refresh alert information are the types of information that will be sent on the backchannel, it should be appreciated that other data may also be sent on the backchannel, including, but not limited to, temperature information, calibration information, and the like.

In exemplary aspects, the backchannel is provided over existing, underutilized pins and wires or lines connecting the DRAM to the SoC. Exemplary pins are the clock enable (CKE) or chip select (CS) pins (or both). Reuse of existing pins saves valuable real estate within the integrated circuit (IC) and avoids the expense of running additional wires to the DRAM. Furthermore, avoiding additional wires eliminates possible electromagnetic interference (EMI) issues that might arise from the presence of the additional wires. Power conservation may also be achieved relative to an aspect with multiple new pins because not as many drivers and receivers are needed on a device with a lower pin count. Other possible solutions include adding an additional pin(s) and wire(s) to the DRAM to provide an appropriate communication backchannel.

The pin reuse techniques or the additional pin techniques allow refresh information to be sent. This includes, but is not limited to, targeted per-bank refresh requests, full chip refresh requests, row refresh requests, and urgent refresh requests. Additionally, error detection and/or correction information (e.g., cyclic redundancy checking (CRC)) may be sent, including, but not limited to, a data CRC fail, or an error correcting code (ECC) event, a command and address (CA) parity or other CRC failure, and an On-DRAM ECC event (correction or fail). Enabling such signals and/or commands to be sent enables next generation proposals for DRAM and particularly for low power (LP) double data rate (DDR) standards such as LP DDR5 DRAM.

Before addressing aspects of the DRAM backchannel communication systems disclosed herein, a brief overview of a basic memory communication system is provided with reference to FIG. 1. The discussion of exemplary aspects of DRAM backchannel communication systems begins below with reference to FIG. 2.

In this regard, FIG. 1 illustrates a memory communication system (also referred to herein as "memory system") 10 that includes an AP 12 (also referred to herein as a SoC) that is operatively coupled to DRAMs 14(1)-14(4). Data lines (DQ15-0) couple the AP 12 to a bank of two DRAMs 14 (i.e., DRAMs 14(1) and 14(2)) while data lines (DQ31-16) couple the AP 12 to a second bank of two DRAMs 14 (i.e., DRAMs 14(3) and 14(4)). CKE and CS lines couple the AP 12 to the DRAMs 14(1)-14(4) (only the CKE lines are illustrated, but it should be understood that the CS lines are essentially the same). It is readily apparent that there is no backchannel available for the memory system 10. That is, the DRAMs 14(1)-14(4) have no channel through which the DRAMS 14(1)-14(4) may perform error correction or manage refresh requests.

Figure 2:
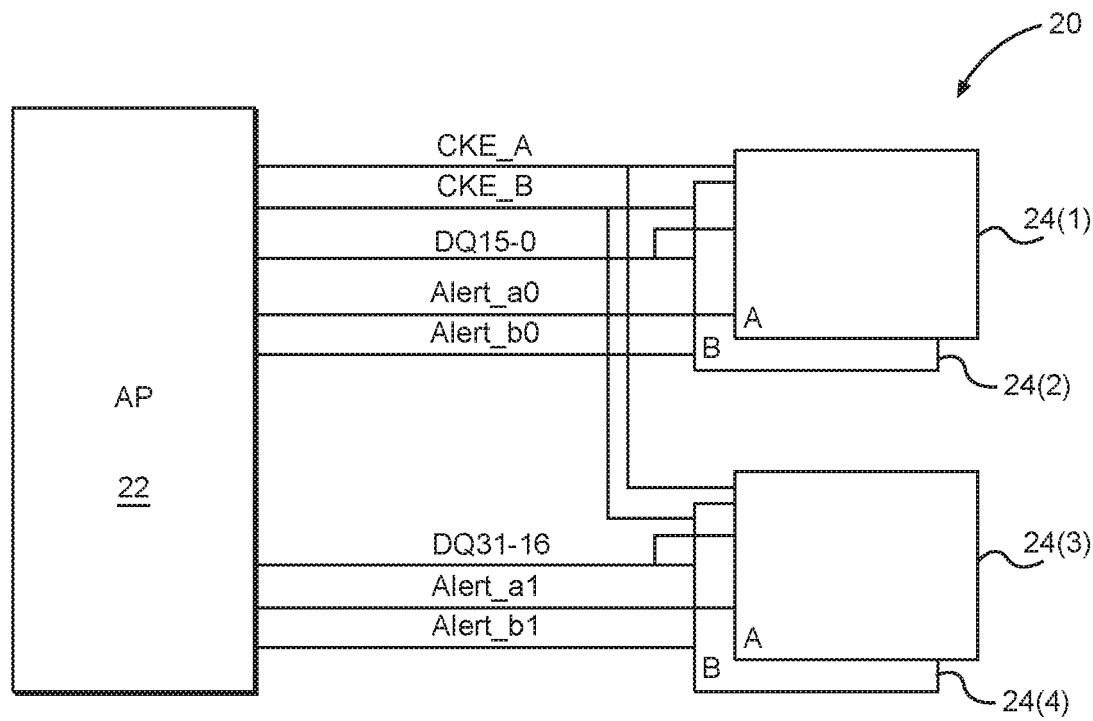
FIG. 2 is a block diagram of an exemplary memory communication system with four additional pins and wires.

A first solution is to add pins to the DRAM with corresponding wires to the AP. In this regard, FIG. 2 illustrates a memory system 20 with an AP 22 and DRAMs 24(1)-24(4). Each of the DRAMs 24(1)-24(4) has a pin added with a corresponding wire coupling the pin to the AP 22. The additional wires are labeled Alert_a0, Alert_b0, Alert_a1, and Alert_b1. Using the additional wires, the DRAMs 24(1)-24(4) may provide commands and signals to perform error correction and/or manage refresh requests. While the additional pins greatly simplify internal design and timing requirements of the memory system 20, the increase in the number of lines routed from the AP 22 to the DRAMs 24(1)-24(4) is undesirable for power and EMI issues. The additional pins increase the overall size of the circuits required by the AP 22. However, the memory system 20 does solve the basic problem of providing a backchannel communication option.

Figure 3A:
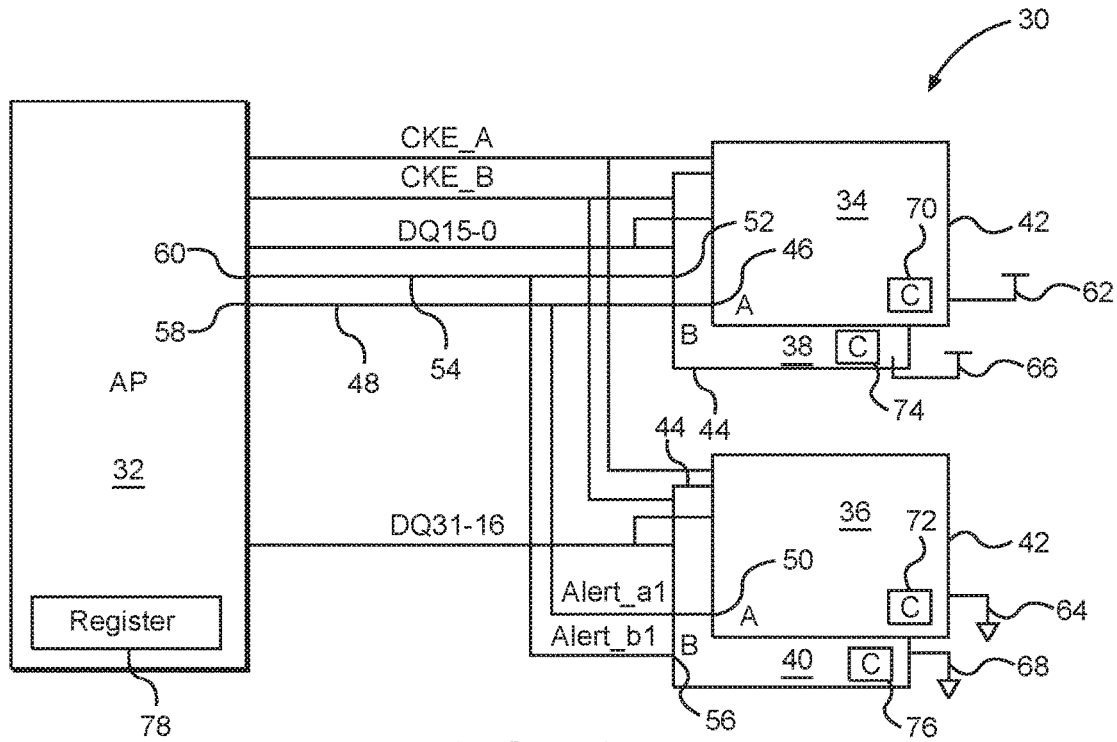
FIG. 3A is a block diagram of another exemplary memory communication system with additional pins and two additional wires.

Given the problems of the first solution illustrated in FIG. 2, exemplary aspects of the present disclosure provide more advantageous solutions. In this regard, a second solution is to provide a common backchannel shared by at least two DRAM dice (i.e., a bank of two DRAM). However, this solution still requires the addition of at least one pin and line with the corresponding disadvantages raised by additional pins and lines. In this regard, FIG. 3A illustrates a memory system 30 with an AP 32 and four DRAMs 34, 36, 38, and 40. The DRAMs 34, 36, 38, and 40 are arranged into bank A 42 and bank B 44. That is, the bank A 42 includes the DRAMs 34 and 36, and the bank B 44 includes the DRAMs 38 and 40. Data lines DQ15-0 couple to the DRAMs 34 and 38, while data lines DQ31-16 couple to the DRAMs 36 and 40.

With continued reference to FIG. 3A, DRAM 34 has one extra pin 46 to which a backchannel line 48 (also labeled Alert_a1 in FIG. 3A) is coupled. Similarly, DRAM 36 has one extra pin 50 to which the backchannel line 48 is coupled. DRAM 38 has one extra pin 52 to which a second backchannel line 54 (also labeled Alert_b1 in FIG. 3A) is coupled. Similarly, DRAM 40 has one extra pin 56 to which the second backchannel line 54 is coupled.

With continued reference to FIG. 3A, the AP 32 has only two AP pins 58 and 60 added, since the backchannel lines 48 and 54 are shared between the banks A 42 and B 44 (i.e., the backchannel line 48 (Alert_a1) is shared by the DRAMs 34 and 36 and the second backchannel line 54 (Alert_b1) is shared by the DRAMs 38 and 40). Thus, compared to the memory system 20 of FIG. 2, the AP 32 has a two pin savings relative to the AP 22. A two pin savings reduces expense associated with the AP 32, and likewise means that the AP 32 has a smaller footprint than the AP 22.

With continued reference to FIG. 3A, the structure of the memory system 30 allows for the possibility that both the DRAMs 34 and 36 within the bank A 42 may try to drive the backchannel line 48 at the same time. Likewise, both the DRAMs 38 and 40 within the bank B 44 may try to drive the second backchannel line 54 at the same time. Accordingly, a communication protocol may be implemented to prevent information collision on the APs pin 58 and 60 at the AP 32. In an exemplary aspect, the communication protocol may be a time division multiplexing (TDM) protocol. A first technique to provide a TDM protocol, illustrated in FIG. 3A, is to establish a master-slave relationship between DRAMs that share a given backchannel line (e.g., the DRAMs 34 and 36 sharing the backchannel line 48 or the DRAMs 38 and 40 sharing the second backchannel line 54) to arbitrate between the DRAMs sharing the backchannel line. Respective external balls 62, 64, 66, and 68 may be associated with each of the DRAMs 34, 36, 38, and 40. The external balls 62 and 66 may be tied high, and the external balls 64 and 68 may be tied low. The polarity of the external balls (high or low) may determine the master-slave arrangement (e.g., master is tied high and slave is tied low (or vice versa)). In place of an explicit master-slave relation, or in addition thereto, simple counters (denoted as box C) 70, 72, 74, and 76 are instantiated in the respective DRAMs 34, 36, 38, and 40. The counters 70 and 72 are reset at the same time, while the counters 74 and 76 are also reset at the same time. The DRAMs 34 and 38, with the external balls 62 and 66 tied high, are active and can drive the backchannel lines 48 and 54 during the first half of the count of the counters 70, 72, 74, and 76. The other DRAMs 36 and 40, with the external balls 64 and 68 tied low, can drive the backchannel lines 48 and 54 during the later half of the count of the counters 70, 72, 74, and 76. The AP 32 is able to tell which of the DRAMs 34, 36, 38, and 40 are tied to a high or low state by reading a register 78, or by decoding the serial data stream when it is presented. Note that instead of the counters, the DRAMs 34, 36, 38, and 40 may have relative importance (e.g., master-slave) so that when coincident alerts are generated, a predetermined DRAM will communicate with the AP 32 before other DRAMs.

Figure 3B:
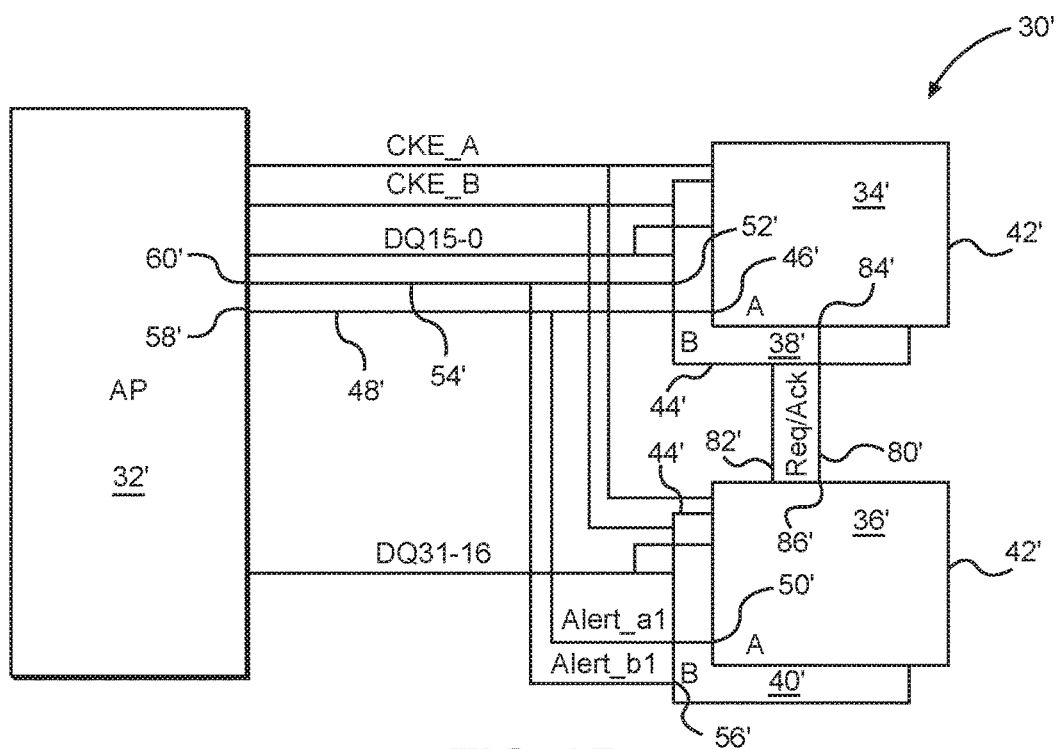
FIG. 3B is a block diagram of another exemplary memory system with two additional wires.

A second technique to provide a TDM protocol is presented with reference to FIG. 3B, in which a memory system 30' is illustrated. The memory system 30' is substantially similar to the memory system 30 of FIG. 3A and similar elements are numbered similarly, but with a prime designation (e.g., the DRAM 34 of the memory system 30 is analogous to DRAM 34' of the memory system 30'). Unless relevant to explaining the second technique, repetitive elements are not discussed again.

The second technique, illustrated in FIG. 3B by the memory system 30', is provided with DRAM-to-DRAM communication links 80' and 82' between the DRAMs 34' and 36' and between the DRAMs 38' and 40' respectively. The communication link 80' could be established, for example, by respective balls 84' and 86' on the DRAMs 34' and 36', and the communication link 82' could be established by similar balls (not illustrated) on the DRAMs 38' and 40'. The communication links 80' and 82' could be dedicated to arbitrate between the two corresponding DRAMs 34' and 36', and 38' and 40' respectively. The arbitration could be a simple open drain/pull-up signaling or other method to arbitrate which of the DRAMs 34' and 36' can use the backchannel line 48', and which of the DRAMs 38' and 40' can use the second backchannel line 54'.

Although the exemplary aspects of FIGS. 3A and 3B require two external balls per DRAM 34, 36, 38, and 40 (34', 36', 38' and 40') (one for the respective backchannel line 48 or 54 (48' or 54') and one for the arbiter (either the low or high of the external balls 62, 64, 66, or 68 or the communication links 80' and 82')), the communication links 80' and 82' are simple to implement and do not need to leave the memory package, requiring fewer top-level package balls. Additionally, the APs 32 and 32' only need two AP pins 58 and 60 or 58' and 60' respectively, which provides a cost savings relative to the AP 22 of FIG. 2.

A third solution is to reuse existing lines between an AP and a DRAM that are currently underutilized. In an exemplary aspect, the reused lines are the CKE and/or CS lines. Typically, these two lines have little traffic and thus are amenable to dual use including the original intent and as a backchannel. That is, the CKE pin is only pulled low by the AP during a refresh or power down cycle (in which case no CRC errors will be generated and refresh requests are not needed). In this exemplary aspect, the DRAMs have the ability to drive this pin when the AP is holding it high (i.e., unused). TDM may also be used to assist in preventing collisions on the line. A first exemplary timing parameter may be: write CMD to CKE low. The AP would not be able to drive the CKE low within a certain time of its last write command (e.g., 32 cycles). Such delay allows the DRAM time to drive a CRC error if needed. A second exemplary timing parameter may be: active CMD to Refresh request. In this case, the DRAM would only be allowed to request a refresh after a certain amount of inactive commands (e.g., two inactive commands) Such delay allows the last CRC to return, and prevents the DRAM from going into self-refresh/power down (AP-drive) until the DRAM is done transmitting its request. The AP would be able to determine if it wants to obey the request for the refresh or place the entire DRAM into power down.

Figure 4:
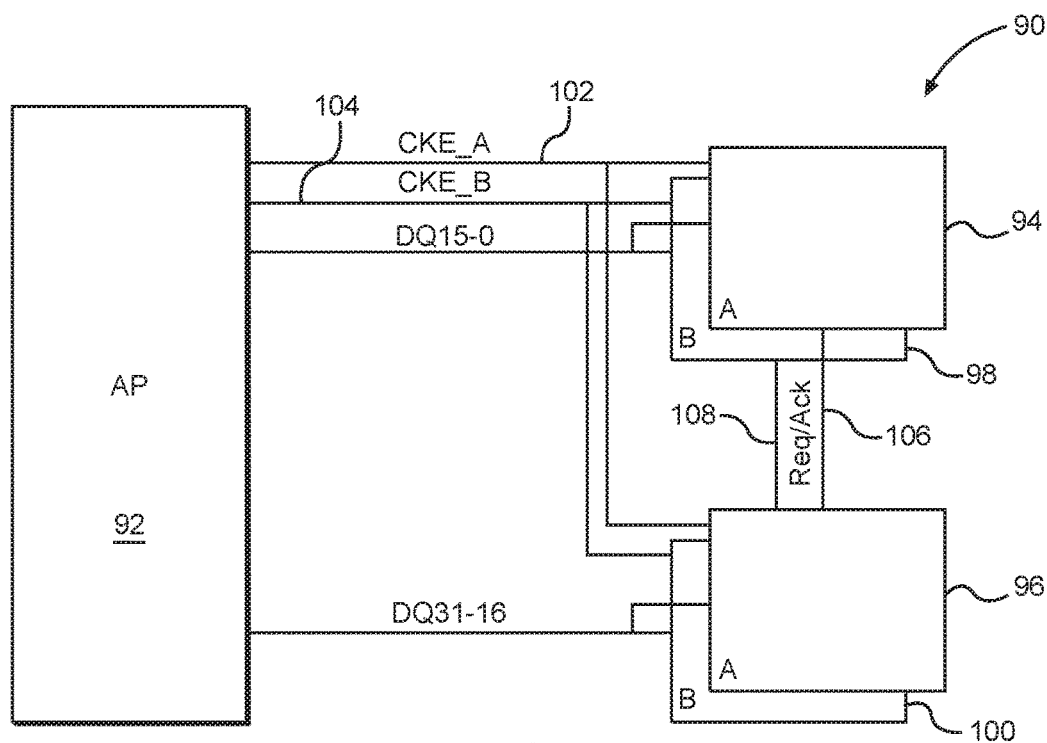
FIG. 4 is a block diagram of another exemplary memory communication system with no additional wires.
Figure 5:
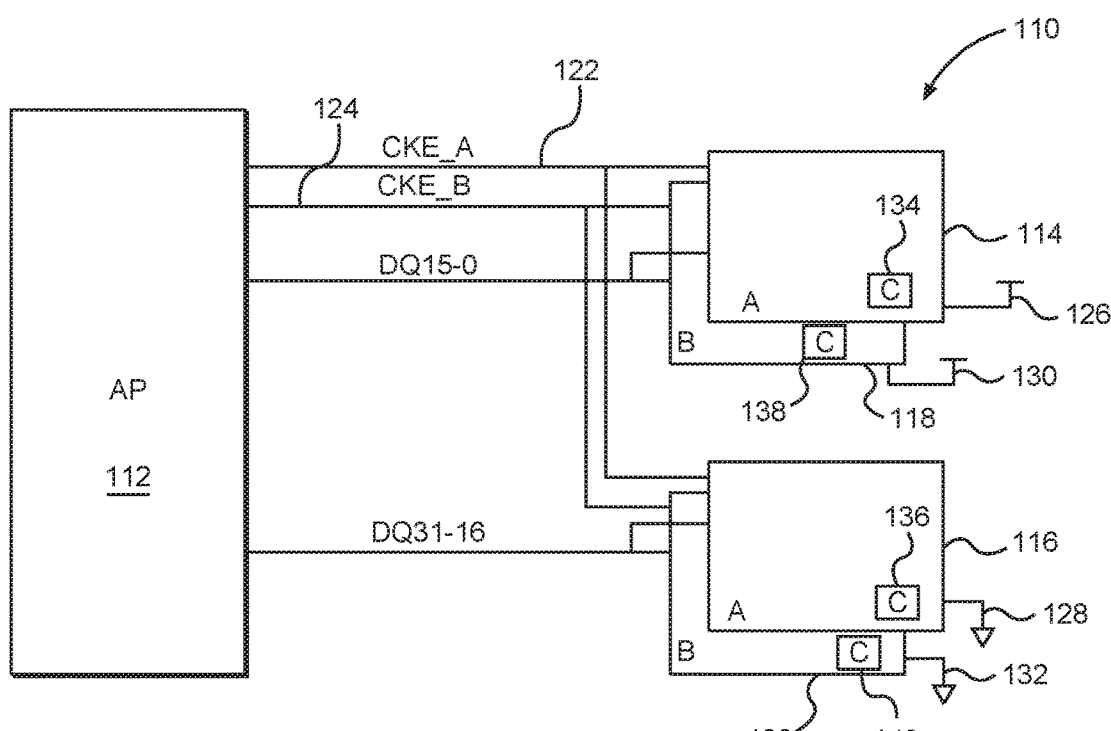
FIG. 5 is a block diagram of another exemplary memory communication system with no additional wires.

In this regard, FIGS. 4 and 5 illustrate two versions of this third solution (i.e., reuse of existing lines). In FIG. 4, a memory system 90 is illustrated with an AP 92 and DRAMs 94, 96, 98, and 100. An existing CKE line 102 (also labeled CKE_A in FIG. 4) couples the DRAMs 94 and 96 to the AP 92. Likewise, an existing CKE line 104 (also labeled CKE_B in FIG. 4) couples the DRAMs 98 and 100 to the AP 92. No additional pins are needed at the AP 92. In FIG. 4, a communication line 106 couples the DRAM 94 to the DRAM 96, and a communication line 108 couples the DRAM 98 to the DRAM 100. Like the communication links 80' and 82' in FIG. 3B, the communication lines 106 and 108 may be positioned internally to the memory package and allow the DRAMs 94, 96, 98, and 100 to communicate and arbitrate therebetween so as to avoid collisions. As noted above, there may be other techniques through which the DRAMs arbitrate signals provided across the backchannel line.

In FIG. 5, a memory system 110 is illustrated with an AP 112 and DRAMs 114, 116, 118, and 120. An existing CKE line 122 (also labeled CKE_A in FIG. 5) couples the DRAMs 114 and 116 to the AP 112. Likewise, an existing CKE line 124 (also labeled CKE_B in FIG. 5) couples the DRAMs 118 and 120 to the AP 112. No additional pins are needed at the AP 112. The DRAMs 114, 116, 118, and 120 are provided with respective external balls 126, 128, 130, and 132. Similar to the memory system 30 in FIG. 3A, the external balls 126 and 130 may be pulled high while the external balls 128 and 132 are pulled low. Again, the external balls 126, 128, 130, 132 may allow establishment of a master-slave relationship between the DRAMs which facilitates arbitration therebetween. Counters 134, 136, 138, and 140 may be used similarly to the counters 70, 72, 74, and 76 in the memory system 30 of FIG. 3A to help avoid collisions. As yet another aspect, one DRAM may be given priority over others so that communication from the prioritized DRAM is provided to the AP 112 before communication from the other DRAMs.

While various commands could be used to implement the alerts and CRC over the proposed backchannel, Table 1 below presents an exemplary list of commands In an exemplary aspect, the commands are a serial data stream of nine (9) bits, but multiple serial streams can be used. It should be appreciated that any data 'word' for the command may take less than five (5) nanoseconds (ns), and would thus be less than the burst time to complete. It should be appreciated that the types of alerts listed in Table 1 are provided only as an example. Other types of alerts and commands between the AP and DRAM may be used over a backchannel, such as alerts pertaining to: DRAM temperature, DRAM timing drift, DRAM PLL clock status, and DRAM calibration status (i.e., an alert to indicate a change of status within the DRAM has occurred for these categories of DRAM operation).

the alert, but also the DRAM that has the condition that generated the alert may be provided to the AP. Using this information, the AP may service the DRAM to solve the condition that generated the alert. This servicing may take place on receipt of the alert, which reduces latency relative to prior arrangements which required the AP to poll each DRAM to determine which DRAM generated the alert and the nature of the condition that generated the alert.

The above discussion focuses on reusing the CKE line. However, other methods may be used to share the backchannel between existing forward only lines. For example, the CS line to the bank A or the bank B or other lines may also be used to transmit information from a DRAM to an AP. The bandwidth of the CS lines can be heavily used during multiple commands, however, so it would be less efficient to find free bandwidth on the CS lines than on the CKE lines. Nevertheless, it could be used in conjunction with the CKE line to convey additional information, or singly to convey limited information. Further note that the nature of the alert may dictate whether it is sent on the backchannel line, especially where the line is reused and/or the activity between the AP and the DRAM may cause the backchannel circuitry to be enabled or disabled dynamically. For example, the backchannel line may be dynamically disabled when a burst read operation is occurring. Once the burst read operation concludes, the backchannel line may be enabled and any pending or queued alerts may be transmitted to the AP.

Additionally, while the above discussion focuses on TDM solutions, other methods can be used such as frequency division, multiple drive levels, or a combination of pull ups and pull downs can be used to voltage-slice the backchannel and transmit information over the existing line. For example,

TABLE 1

Commands for Backchannel

| Chip ID <0> | | Type <3:1> | | Comment <8:4> | | |
|---|---|---|---|---|---|---|
| 0 | DRAM 0 | 000 | DQ Write Fail | 00000 | Bubble Failure (Illegal WS output) | Lane 0 |
| | | | | 00001 | Map Failure (Symbol Decode is off map) | |
| | | | | 00010 | CRC Failure (CRC not incorrect checksum) | |
| | | | | 00011 | Sync Failure (Incorrerct EOP detect) | |
| | | | | YYYxx | | Lane YYY |
| | | | | 11100 | Bubble Failure (Illegal WS output) | Lane 7 |
| | | | | 11101 | Map Failure (Symbol Decode is off map) | |
| | | | | 11110 | CRC Failure (CRC not incorrect checksum) | |
| | | | | 11111 | Sync Failure (Incorrerct EOP detect) | |
| | | 001 | CA CRC Failure | YYYYY | Command Sequence YYYY | |
| | | 010 | On-DRAM ECC Alert | YYYYY | Read MRR YYYYY for ECC error details | |
| | | 011 | Per-Bank Refresh Request | 0YYYY | Refresh request bank YYYY | Bank YYYY |
| | | | | 1YYYY | Urgent request bank YYYY | Bank YYYY |
| | | 100 | Full Chip Refresh Request | YYYYY | Urgency Level | |
| 1 | DRAM1 | 000 | DQ Write Fail | 00000 | Bubble Failure (Illegal WS output) | Lane 0 |
| | | | | 00001 | Map Failure (Symbol Decode is off map) | |
| | | | | 00010 | CRC Failure (CRC not incorrect checksum) | |
| | | | | 00011 | Sync Failure (Incorrerct EOP detect) | |
| | | | | YYYxx | | Lane YYY |
| | | | | 11100 | Bubble Failure (Illegal WS output) | Lane 7 |
| | | | | 11101 | Map Failure (Symbol Decode is off map) | |
| | | | | 11110 | CRC Failure (CRC not incorrect checksum) | |
| | | | | 11111 | Sync Failure (Incorrerct EOP detect) | |
| | | 001 | CA CRC Failure | YYYYY | Command Sequence YYYY | |
| | | 010 | On-DRAM ECC Alert | YYYYY | Read MRR YYYYY for ECC error details | |
| | | 011 | Per-Bank Refresh Request | 0YYYY | Refresh request bank YYYY | Bank YYYY |
| | | | | 1YYYY | Urgent request bank YYYY | Bank YYYY |
| | | 100 | Full Chip Refresh Request | YYYYY | Urgency Level | |

Note further that by allowing other alert information to be passed through the backchannel line, not only the nature of if a CKE pin tries to drive low from the AP, but a local AP receiver senses the line is not going to its Voltage out Low (VOL) level, it could assume one of the DRAMs is pulling on the line and trying to make a request for CRC or refresh.

The DRAM backchannel communication systems and methods according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 6:
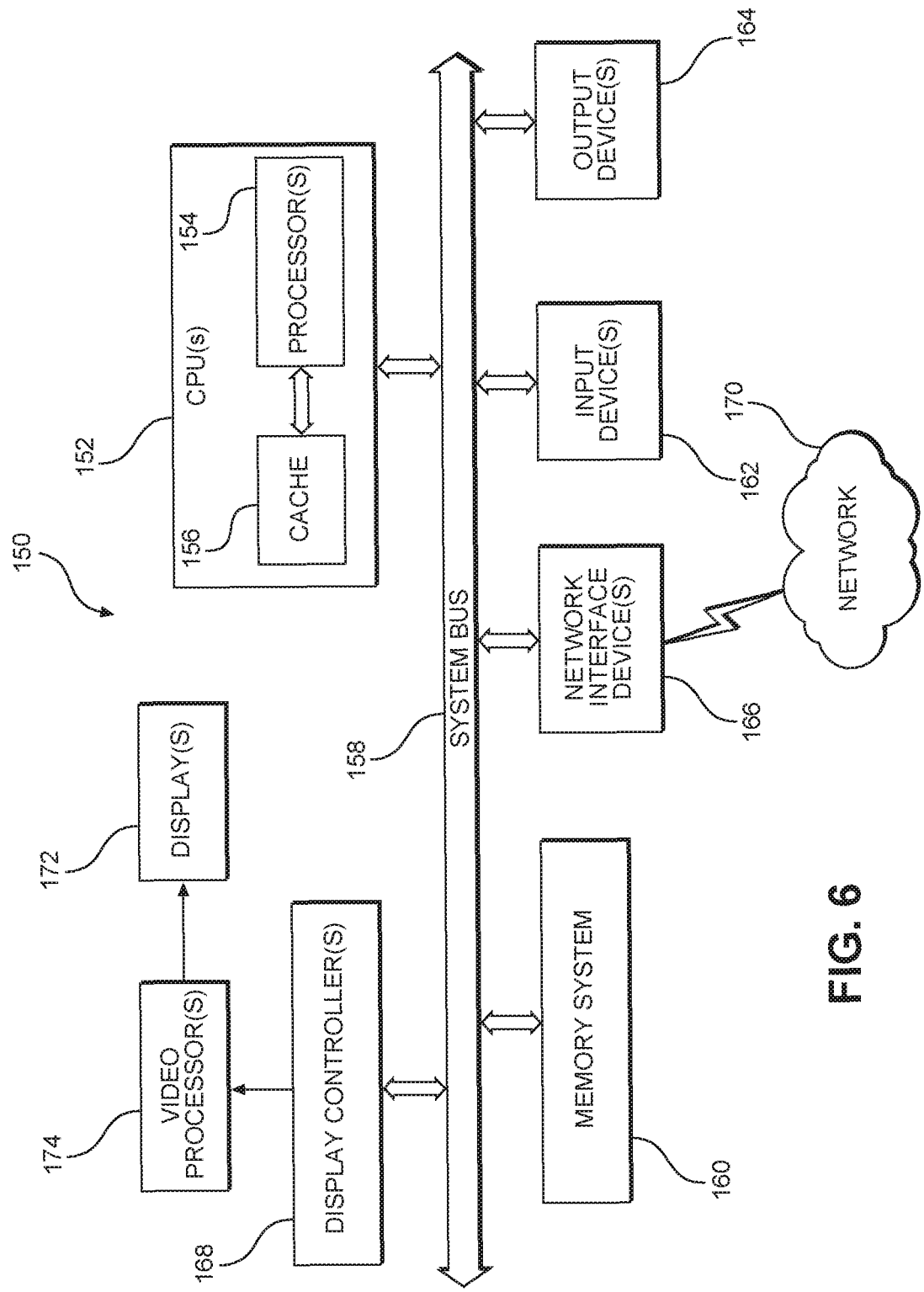
FIG. 6 is a block diagram of an exemplary processor-based system that can include the memory communication systems of FIGS. 2-5.

In this regard, FIG. 6 illustrates an example of a processor-based system 150 that can employ the DRAM backchannel communication systems and methods illustrated in FIGS. 2-5. In this example, the processor-based system 150 includes one or more central processing units (CPUs) 152, each including one or more processors 154. The CPU(s) 152 may have cache memory 156 coupled to the processor(s) 154 for rapid access to temporarily stored data. The CPU(s) 152 is coupled to a system bus 158 and can intercouple devices included in the processor-based system 150. As is well known, the CPU(s) 152 communicates with these other devices by exchanging address, control, and data information over the system bus 158.

Other devices can be connected to the system bus 158. As illustrated in FIG. 6, these devices can include a memory system 160, one or more input devices 162, one or more output devices 164, one or more network interface devices 166, and one or more display controllers 168, as examples. The input device(s) 162 can include any type of input device, including but not limited to input keys, switches, voice processors, etc. The output device(s) 164 can include any type of output device, including but not limited to audio, video, other visual indicators, etc. The network interface device(s) 166 can be any devices configured to allow exchange of data to and from a network 170. The network 170 can be any type of network, including but not limited to a wired or wireless network, a private or public network, a local area network (LAN), a wide area network (WAN), a wireless local area network (WLAN), BLUETOOTH™, and the Internet. The network interface device(s) 166 can be configured to support any type of communication protocol desired.

The CPU(s) 152 may also be configured to access the display controller(s) 168 over the system bus 158 to control information sent to one or more displays 172. The display controller(s) 168 sends information to the display(s) 172 to be displayed via one or more video processors 174, which process the information to be displayed into a format suitable for the display(s) 172. The display(s) 172 can include any type of display, including, but not limited to, a cathode ray tube (CRT), a liquid crystal display (LCD), a light emitting diode (LED) display, a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory system comprising:
an applications processor (AP) comprising an AP pin;
at least one dynamic random access memory (DRAM) comprising a pin; and
a backchannel line coupling the AP pin to the pin;
wherein the AP is configured to receive synchronization information comprising at least information indicative of sync failure from the at least one DRAM through the backchannel line wherein the backchannel line is configured to accommodate time division multiplexed signals from the at least one DRAM to the AP.

2. The memory system of claim 1, further comprising:
a second DRAM coupled to the backchannel line;
a second backchannel line coupled to the AP through a second AP pin;
a third DRAM coupled to the second backchannel line; and
a fourth DRAM coupled to the second backchannel line.

3. The memory system of claim 2, further comprising a first communication line coupling the at least one DRAM to the second DRAM and a second communication line coupling the third DRAM to the fourth DRAM, wherein the first communication line is configured to convey arbitration signals between the at least one DRAM and the second DRAM.

* * * * *